(12) United States Patent
Katsuki et al.

(10) Patent No.: US 12,336,159 B2
(45) Date of Patent: Jun. 17, 2025

(54) ELECTROMAGNETIC WAVE SHIELDING FILM

(71) Applicant: TATSUTA ELECTRIC WIRE & CABLE CO., LTD., Higashiosaka (JP)

(72) Inventors: Takahiko Katsuki, Kizugawa (JP); Hiroshi Tajima, Kizugawa (JP); Sougo Ishioka, Kizugawa (JP); Kenji Kamino, Kizugawa (JP)

(73) Assignee: TATSUTA ELECTRIC WIRE & CABLE CO., LTD., Higashiosaka (JP)

( * ) Notice: Subject to any disclaimer, the term of this patent is extended or adjusted under 35 U.S.C. 154(b) by 0 days.

(21) Appl. No.: 18/689,247

(22) PCT Filed: Sep. 9, 2022

(86) PCT No.: PCT/JP2022/033822
§ 371 (c)(1),
(2) Date: Mar. 5, 2024

(87) PCT Pub. No.: WO2023/038097
PCT Pub. Date: Mar. 16, 2023

(65) Prior Publication Data
US 2025/0133710 A1   Apr. 24, 2025

(30) Foreign Application Priority Data
Sep. 9, 2021   (JP) .................... 2021147043

(51) Int. Cl.
*H05K 9/00* (2006.01)
(52) U.S. Cl.
CPC .................. *H05K 9/0086* (2013.01)
(58) Field of Classification Search
CPC .................................. H05K 9/0086
See application file for complete search history.

(56) References Cited

U.S. PATENT DOCUMENTS

| | | | | |
|---|---|---|---|---|
| 2014/0098501 | A1* | 4/2014 | Kawaguchi | H05K 9/0086 174/382 |
| 2024/0107731 | A1* | 3/2024 | Du | H05K 9/0083 |
| 2024/0172405 | A1* | 5/2024 | Katsuki | B32B 7/025 |

FOREIGN PATENT DOCUMENTS

| | | |
|---|---|---|
| JP | 6202177 B1 | 9/2017 |
| JP | 6404533 B1 | 10/2018 |
| JP | 2021068884 B | 4/2021 |

OTHER PUBLICATIONS

International Search Report issued in connection with underlying PCT application PCT/JP2022/033822.

* cited by examiner

*Primary Examiner* — Hung V Ngo
(74) *Attorney, Agent, or Firm* — KMF Patent Services, PLLC; Kenneth M Fagin

(57) ABSTRACT

An electromagnetic wave shielding film with high bending resistance and high electromagnetic wave-shielding characteristics, even when used with high-frequency signal transmission, is disclosed. The electromagnetic wave shielding film includes an adhesive layer; a shielding layer placed on the adhesive layer; and an insulating layer placed on the shielding layer, wherein a plurality of openings having an opening area of 1 to 5000 $\mu m^2$ are formed in the shielding layer, the openings include first openings having opening areas of more than 1 $\mu m^2$ and 300 $\mu m^2$ or less and second openings having opening areas of more than 300 $\mu m^2$ and 5000 $\mu m^2$ or less, and the percentage of the number (cumulative frequency) of the first openings among the openings is 30 to 90%, and the percentage of the number (cumulative frequency) of the second openings among the openings is 10 to 70%.

5 Claims, 9 Drawing Sheets

ELECTROMAGNETIC WAVE SHIELDING FILM

TECHNICAL FIELD

The present invention relates to an electromagnetic wave shielding film.

BACKGROUND ART

Conventionally, an electromagnetic wave shielding film, for example, is attached to a printed circuit board such as a flexible printed circuit board (FPC) to shield it from electromagnetic waves from outside.

Usually, an electromagnetic wave shielding film has a structure in which an electrically conductive adhesive layer, a shielding layer including a metal thin film or the like, and an insulating layer are layered in this order. A printed circuit board with such an electromagnetic wave shielding film superposed thereon is heat-pressed to attach the electromagnetic wave shielding film to the printed circuit board via the electrically conductive adhesive layer, thereby preparing a shielded printed circuit board. After such adhesion, components are mounted on the shielded printed circuit board by solder reflow. Meanwhile, the printed circuit board has a structure in which a printed pattern on a base film is covered with an insulating film.

When the shielded printed circuit board is heated by the heat-pressing or the solder reflow in production of the shielded printed circuit board, a gas is generated from the adhesive layer of the electromagnetic wave shielding film or the insulating film of the printed circuit board or the like. In a case where the base film of the printed circuit board is formed from a resin with high moisture absorbency, such as polyimide, water vapor may also be generated from the base film by heating. These volatile components generated from the adhesive layer, the insulating film, and the base film cannot pass through the shielding layer, and therefore accumulate between the shielding layer and the adhesive layer. Accordingly, if rapid heating is carried out in the solder reflow process, the interlayer adhesion between the shielding layer and the adhesion layer may be broken by the volatile components accumulating between the shielding layer and the adhesive layer to deteriorate the electromagnetic wave shielding characteristics.

To solve such a problem, a plurality of openings are provided in the shielding layer (metal thin film) to improve gas permeability.

When the shielding layer has a plurality of openings, the volatile components can pass through the shielding layer via the openings even if the volatile components are generated. It is thus possible to prevent the volatile components from accumulating between the shielding layer and the electrically conductive adhesive layer, so that it is possible to prevent the deterioration of the shielding characteristics due to the breakage of the electromagnetic wave interlayer adhesion.

As such an electromagnetic wave shielding film having openings in the shielding layer (metal thin film), Patent Literature 1 discloses an electromagnetic wave shielding film including: an electrically conductive adhesive layer; a shielding layer placed on the electrically conductive adhesive layer; and an insulating layer placed on the shielding layer, wherein a plurality of openings are formed in the shielding layer, no blister is caused in the following evaluation of interlayer peeling, the electromagnetic wave shielding characteristic of the electromagnetic wave shielding film at 200 MHz measured by the KEC method is 85 dB or more, the opening area and the opening interval due to the openings satisfy predetermined relationship.

Patent Literature 2 discloses an electromagnetic wave shielding sheet including: an insulating layer, a metal layer, and an electrically conductive adhesive layer. The metal layer has a film thickness of 0.2 to 5 μm, has 10000 to 200000 openings having an area of 0.7 to 5000 μm² per square centimeter, and has an opening rate of 0.05 to 40%; and regarding the openings in the metal layer, the distance from the center point of an opening to the center point of the nearest opening and the number of the openings in the area of the metal layer S satisfy predetermined relationships.

CITATION LIST

Patent Literature

Patent Literature 1: JP 6404533 B
Patent Literature 2: JP 6202177 B

SUMMARY OF INVENTION

Technical Problem

In the electromagnetic wave shielding films (electromagnetic wave shielding sheets) disclosed in Patent Literatures 1 and 2, it is possible to prevent the volatile components from accumulating between the shielding layer (metal layer) and the electronically conductive adhesive layer, so that it is possible to prevent the breakage of the interlayer adhesion to some degree. However, if the openings are formed in the shielding layers, the electromagnetic wave-shielding characteristic or the bending resistance deteriorates. A problem was that especially if the electromagnetic wave shielding films were used for a transmission circuit that transmits signals in a high frequency region of 50 GHz or more, the electromagnetic wave shielding characteristics were insufficient.

The present invention has been made to solve the above-described problems, and an object of the present invention is to provide an electromagnetic wave shielding film having sufficiently high bending resistance and having a sufficiently high electromagnetic wave shielding characteristic even if the film is used for a transmission circuit that transmits signals in a high frequency region.

The electromagnetic wave shielding film of the present invention is an electromagnetic wave shielding film including: an adhesive layer; a shielding layer placed on the adhesive layer; and an insulating layer placed on the shielding layer, wherein a plurality of openings having an opening area of 1 to 5000 μm² are formed in the shielding layer, the openings include first openings having opening areas of more than 1 μm² and 300 μm² or less and second openings having opening areas of more than 300 μm² and 5000 μm² or less, and a percentage of the number (cumulative frequency) of the first openings among the openings is 30 to 90%, and a percentage of the number (cumulative frequency) of the second openings among the openings is 10 to 70%.

The plurality of openings having opening areas of 1 to 5000 μm² are formed in the electromagnetic wave shielding film of the present invention.

Therefore, even if volatile components are generated at the time of disposing the electromagnetic wave shielding film on a printed circuit board, the volatile components can pass through the openings. Accordingly, the volatile components can be prevented from accumulating between the shielding layer and the electrically conductive adhesive layer, and the breakage of the interlayer adhesion can be prevented.

In the electromagnetic wave shielding film of the present invention, the openings are formed in the shielding layer, and the openings include the first openings having opening areas of more than 1 $\mu m^2$ and 300 $\mu m^2$ or less and the second openings having opening areas of more than 300 $\mu m^2$ and 5000 $\mu m^2$ or less.

In an electromagnetic wave shielding film, the electromagnetic wave shielding characteristic depends on the area of the shielding layer. Accordingly, if the areas of the openings of a shielding layer are increased for improving the permeability to volatile components, the electromagnetic wave shielding characteristic deteriorates. That is, the electromagnetic wave shielding characteristic and the permeability to volatile components have trade-off relationship.

If the sizes of the openings are uniformly adjusted, it is difficult to balance the electromagnetic wave shielding characteristic and the permeability to volatile components at a high level.

In the electromagnetic wave shielding film of the present invention, the first openings having small opening areas and the second openings having large opening areas are meanwhile formed in the shielding layer.

The coexistence of the second openings having large opening areas and the first openings having small opening areas thus enables improving the permeability to volatile components while maintaining the electromagnetic wave shielding characteristic.

In the electromagnetic wave shielding film of the present invention, the percentage of the number (cumulative frequency) of the first openings among the openings is 30 to 90%, and the percentage of the number (cumulative frequency) of the second openings among the openings is 10 to 70%.

With the percentages of the numbers in such ranges, the permeability to volatile components and the electromagnetic wave shielding characteristic can be sufficiently improved.

If the percentage of the number (cumulative frequency) of the first openings among the openings is less than 30%, the percentage of the number of the second openings increases, and the electromagnetic wave shielding characteristic therefore deteriorates.

If the percentage of the number (cumulative frequency) of the first openings among the openings exceeds 90%, the percentage of the number of the second openings decreases, and the permeability to volatile components therefore deteriorates.

In the electromagnetic wave shielding film of the present invention, the shielding layer preferably has an opening rate of 3 to 10%.

With the opening rate of the shielding layer in the above-mentioned range, the permeability to volatile component and the electromagnetic wave shielding characteristic can be improved in a balanced manner.

If the opening rate of the shielding layer is less than 3%, the permeability to volatile components is likely to deteriorate.

If the opening rate of the shielding layer exceeds 10%, the electromagnetic wave shielding characteristic is likely to deteriorate. The strength of the shielding layer also deteriorates, and the bending resistance is likely to deteriorate.

The electromagnetic wave shielding film of the present invention preferably has a water vapor transmission rate of 40 g or more per $m^2 \cdot 24$ h at a temperature of 80° C., a humidity of 95% RH, and a differential pressure of 1 atm, in accordance with JIS K 7129.

When the water vapor transmission rate is within such range, the volatile components are unlikely to accumulate between the shielding layer and the adhesive layer, and thus, the interlayer adhesion between the shielding layer and the adhesive layer is unlikely to be broken by the volatile components.

In the electromagnetic wave shielding film of the present invention, the shielding layer preferably includes a metal layer.

The metal layer preferably contains at least one metal selected from the group consisting of copper, silver, gold, aluminum, nickel, tin, palladium, chromium, titanium, and zinc.

These metals are suitable as the shielding layer of the electromagnetic wave shielding film.

Advantageous Effects of Invention

According to the present invention, an electromagnetic wave shielding film having sufficiently high bending resistance and having a sufficiently high electromagnetic wave shielding characteristic even if the film is used for a transmission circuit that transmits signals in a high frequency region can be provided.

DESCRIPTION OF EMBODIMENTS

The electromagnetic wave shielding film of the present invention is specifically described. However, the present invention is not limited to the embodiments below, and can be applied with appropriate modification within the scope of the present invention without departing from the gist thereof.

Figure 1:
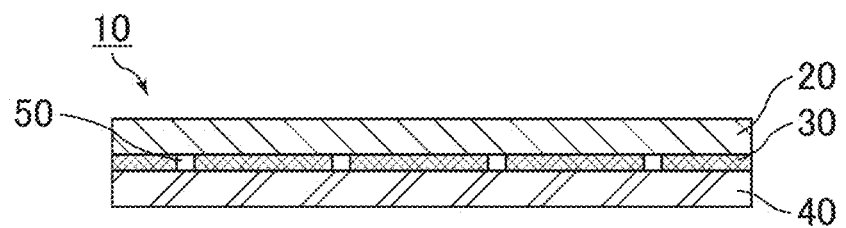
FIG. 1 is a cross-sectional view schematically showing one example of the electromagnetic wave shielding film of the present invention.

FIG. 1 is a cross-sectional view schematically showing one example of the electromagnetic wave shielding film of the present invention.

As shown in FIG. 1, an electromagnetic wave shielding film 10 is an electromagnetic wave shielding film including an insulating layer 20, a shielding layer 30, and an adhesive layer 40 stacked in this order.

A plurality of openings 50 having opening areas of 1 to 5000 $\mu m^2$ are formed in the shielding layer 30. The openings 50 preferably have opening areas of 50 to 5000 $\mu m^2$, and further preferably have 50 to 2000 $\mu m^2$.

Even if volatile components are generated at the time of disposing the electromagnetic wave shielding film 10 on a printed circuit board, the formation of such openings 50 enables volatile components to pass through the openings. Accordingly, volatile components can be prevented from accumulating between the shielding layer 30 and the adhesive layer 40, and the breakage of interlayer adhesion can be prevented.

The openings 50 include first openings 51 having opening areas of more than 1 $\mu m^2$ and 300 $\mu m^2$ or less and second openings 52 having opening areas of more than 300 $\mu m^2$ and 5000 $\mu m^2$ or less.

In an electromagnetic wave shielding film, the electromagnetic wave shielding characteristic depends on the area of the shielding layer. Accordingly, if the areas of the openings of the shielding layer are increased for improving the permeability to volatile components, the electromagnetic wave shielding characteristic deteriorates. That is, the electromagnetic wave shielding characteristic and the permeability to volatile components have trade-off relationship.

If the sizes of the openings are uniformly adjusted, it is difficult to balance the electromagnetic wave shielding characteristic and the permeability to volatile components at a high level.

In the electromagnetic wave shielding film 10, the first openings 51 having small opening areas and the second openings 52 having large opening areas are meanwhile formed in the shielding layer 30.

The coexistence of the second openings 52 having large opening areas and the first openings 51 having small opening areas thus enables improving the permeability to volatile components while maintaining the electromagnetic wave shielding characteristic.

In the electromagnetic wave shielding film 10, the percentage of the number (cumulative frequency) of the first openings 51 to the openings 50 is 30 to 90%, and the percentage of the number (cumulative frequency) of the second openings 52 to the openings 50 is 10 to 70%.

The percentage of the number (cumulative frequency) of the first openings 51 is preferably 30 to 80%, and the percentage of the number (cumulative frequency) of the second openings 52 is preferably 20 to 70%.

With the percentages of the numbers in such ranges, the permeability to volatile components and the electromagnetic wave shielding characteristic can be sufficiently improved.

If the percentage of the number (cumulative frequency) of the first openings among the openings is less than 30%, the percentage of the number of the second openings increases, and the shielding characteristic therefore deteriorates.

If the percentage of the number (cumulative frequency) of the first openings among the openings exceeds 90%, the percentage of the number of the second openings decreases, and the permeability to volatile components therefore deteriorates.

The first openings and the second openings can be determined, and the percentage of the number (cumulative frequency) of the first openings and the percentage of the number (cumulative frequency) of the second openings can be measured herein by the following method.

An image of the shielding layer is acquired using a scanning electron microscope (SEM). Next, the acquired image is binarized into white and black corresponding to the shielding layer 30 parts and the void parts of the openings 50, respectively, using image analysis software "GIMP2.10.6". It is subsequently determined from the number of pixels the void parts in the openings 50 whether each of the openings 50 is a first opening 51 or a second opening 52. The number of the first openings 51 and the number of the second openings 52 are counted to calculate the percentage of the number (cumulative frequency) of the first openings and the percentage of the number (cumulative frequency) of the second openings.

In the electromagnetic wave shielding film 10, the opening rate of the shielding layer 30 is preferably 3 to 10%.

With the opening rate of the shielding layer 30 in the above-mentioned range, the permeability to volatile components and the electromagnetic wave shielding characteristic can be improved in a balanced manner.

If the opening rate of the shielding layer is less than 3%, the permeability to volatile components is likely to deteriorate.

If the opening rate of the shielding layer exceeds 10%, the electromagnetic wave shielding characteristic is likely to deteriorate. The strength of the shielding layer also deteriorates, and the bending resistance is likely to deteriorate.

The opening rate of the shielding layer used herein means a value measured by the following method.

An image of the shielding layer is acquired using a scanning electron microscope (SEM). Next, the acquired image is binarized into white and black corresponding to the shielding layer 30 parts and the void parts of the openings 50, respectively, using image analysis software "GIMP2.10.6". The opening rate is subsequently calculated from the number of pixels of the shielding layer 30 part and the number of pixels of the void parts in the openings 50.

In the electromagnetic wave shielding film 10, the density of the openings 50 in the shielding layer 30 is not limited, and is preferably 10 to 1000 openings/$mm^2$, more preferably 20 to 500 openings/$mm^2$, further preferably 50 to 200 openings/$mm^2$.

If the density of the openings in the shielding layer is less than 10 openings/$mm^2$, the paths for volatile components are so narrow that breakage of the interlayer adhesion is likely to occur.

If the density of the openings in the shielding layer exceeds 1000 openings/$mm^2$, the strength of the shielding layer deteriorates, and the shielding layer tends to be broken.

In the electromagnetic wave shielding film 10, the thickness of the shielding layer 30 is preferably 0.1 to 20 µm, more preferably 0.5 to 10 µm, further preferably 1.0 to 6 µm.

If the thickness of the shielding layer is less than 0.1 µm, the shielding layer is so thin that the shielding layer has poor strength. Therefore, the bending resistance deteriorates. Since the shielding layer is unlikely to fully reflect or absorb electromagnetic waves, the electromagnetic wave shielding characteristic deteriorates.

If the thickness of the shielding layer exceeds 20 µm, the whole electromagnetic wave shielding film is thickened and difficult to handle.

In the electromagnetic wave shielding film 10, the shielding layer 30 may include a metal layer, or may include an electrically conductive adhesive layer.

If the shielding layer 30 includes a metal layer, the metal layer preferably contains at least one metal selected from the group consisting of copper, silver, gold, aluminum, nickel, tin, palladium, chromium, titanium, and zinc. The metal layer may contain an alloy of at least two selected from the group consisting of these.

These metals are suitable as the shielding layer of the electromagnetic wave shielding film.

If the shielding layer 30 includes an electrically conductive adhesive layer, the electrically conductive adhesive layer is preferably constituted of electrically conductive particles and an adhesive resin composition.

The electrically conductive particle is not limited, and may be a metal fine particle, a carbon nanotube, a carbon fiber, a metal fiber, or the like.

The materials of the adhesive resin composition is not limited, and the adhesive resin composition used may be, for example, a thermoplastic resin composition such as a styrene resin composition, a vinyl acetate resin composition, a polyester resin composition, a polyethylene resin composition, a polypropylene resin composition, an imide resin composition, an amide resin composition, or an acrylic resin compositions; or a thermosetting resin composition such as a phenolic resin composition, an epoxy resin composition, a urethane resin composition, a melamine resin composition, or an alkyd resin composition.

The material for the adhesive resin composition may be any one of these, or a combination of two or more thereof.

Then, the arrangement of the first openings 51 and the second openings 52 in the electromagnetic wave shielding film 10 is described.

Figure 2A:
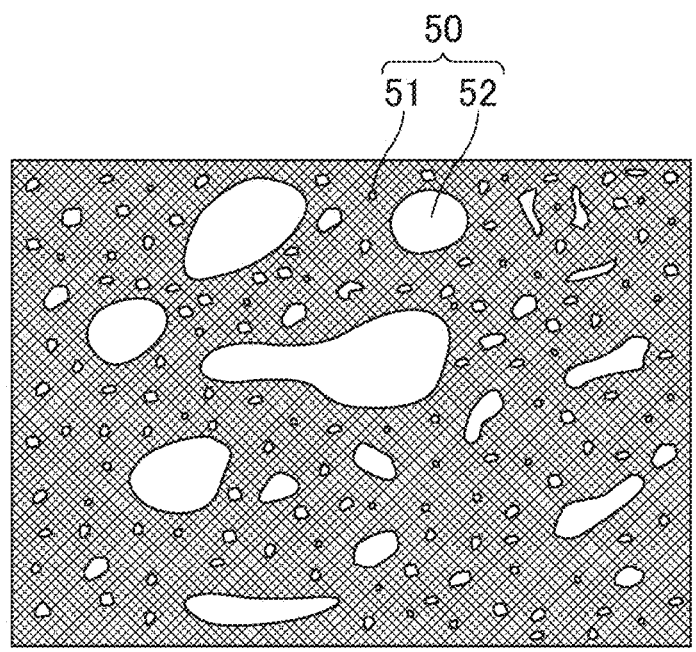
FIG. 2A is a plan view schematically showing one example of the shielding layer of an electromagnetic wave shielding film of the present invention.

FIG. 2A is a plan view schematically showing one example of the shielding layer of an electromagnetic wave shielding film of the present invention.

Figure 2B:
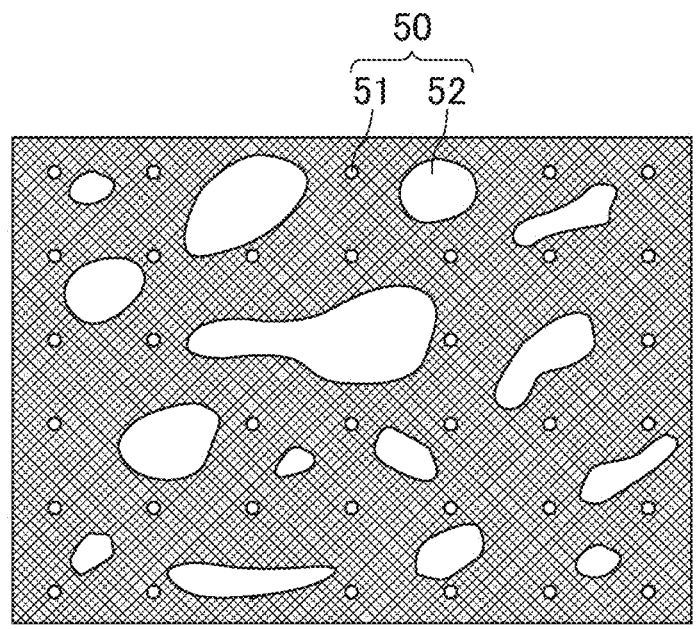
FIG. 2B is a plan view schematically showing another example of the shielding layer of an electromagnetic wave shielding film of the present invention.

FIG. 2B is a plan view schematically showing another example of the shielding layer of an electromagnetic wave shielding film of the present invention.

Figure 2C:
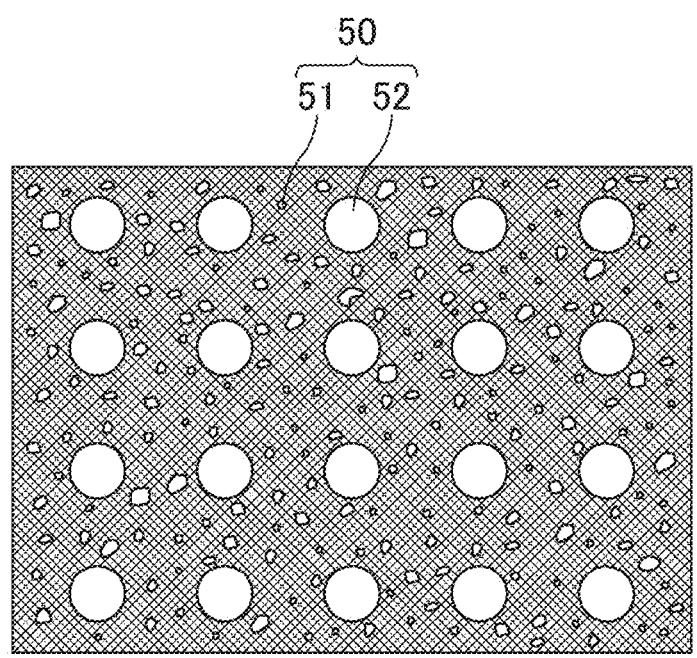
FIG. 2C is a plan view schematically showing another example of the shielding layer of an electromagnetic wave shielding film of the present invention.

FIG. 2C is a plan view schematically showing another example of the shielding layer of an electromagnetic wave shielding film of the present invention.

Figure 2D:
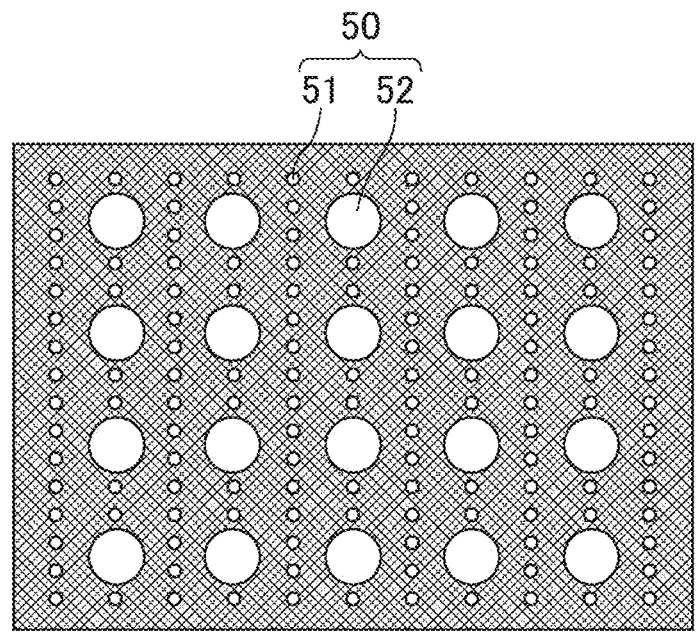
FIG. 2D is a plan view schematically showing another example of the shielding layer of an electromagnetic wave shielding film of the present invention.

FIG. 2D is a plan view schematically showing another example of the shielding layer of an electromagnetic wave shielding film of the present invention.

As shown in FIG. 2A, the shapes and arrangement of the first openings 51 and the second openings 52 may be irregularly formed in the electromagnetic wave shielding film 10.

Examples of the method for forming such first openings 51 and such second openings 52 include the following method.

Metal foil containing a sparingly soluble component that has poor solubility to an etchant and an easily soluble component that has a higher solubility to the etchant than the sparingly soluble component is first provided. The metal foil may be immersed in the etchant to dissolve the easily soluble component to thereby form openings at the positions where the easily soluble component was present.

The percentage of the number (cumulative frequency) of the first openings 51 and the percentage of the number (cumulative frequency) of the second openings 52 can be controlled by incorporating a component having such sizes as to form the first openings 51 and a component having such sizes as to form the second openings 52 into the metal foil as the easily soluble component and adjusting the composition of the etchant, the etching conditions, and the like.

The shielding layer having the first openings 51 and the second openings 52 as shown in FIG. 2A has an unevenness between the portion where the openings are formed and the portion where the shield layer is present. This generates a portion where a large area of shielding layer is present. The electromagnetic wave shielding film 10 having such portions improves in the electromagnetic wave shielding characteristic.

As shown in FIG. 2B, the first openings 51 are regularly formed at regular intervals in the electromagnetic wave shielding film 10, and the shapes and the arrangement of the second openings 52 may be irregularly formed in the electromagnetic wave shielding film 10.

Examples of the method for forming such first openings 51 and such second openings 52 include the following method.

Metal foil containing a sparingly soluble component that has poor solubility to an etchant and an easily soluble component that has a higher solubility to the etchant than the sparingly soluble component is first provided. The metal foil may be immersed in the etchant to dissolve the easily soluble component to thereby form openings at the positions where the easily soluble component was present.

In this case, a component to form the second openings 52 is incorporated into the metal foil as the easily soluble component. Thus, the shielding layer in which the second openings 52 of any shape are irregularly formed can be formed.

The first openings 51 can then be regularly formed in the shielding layer at regular intervals with a laser or the like to form the shielding layer 30 in which the first openings 51 are regularly formed at regular intervals and the second openings 52 of any shape are irregularly formed as shown in FIG. 2B.

As shown in FIG. 2C, the shapes and the arrangement of the first openings 51 may be irregularly formed, and the second openings 52 are regularly formed at regular intervals in the electromagnetic wave shielding film 10.

Examples of the method for forming such first openings 51 and such second openings 52 include the following method.

Metal foil containing a sparingly soluble component that has poor solubility to an etchant and an easily soluble component that has a higher solubility to the etchant than the sparingly soluble component is first provided. The metal foil may be immersed in the etchant to dissolve the easily soluble component to thereby form openings at the positions where the easily soluble component was present.

In this case, a component to form the first openings 51 is incorporated into the metal foil as the easily soluble component. Thus, the shielding layer in which the first openings 51 of any shape are irregularly formed can be formed.

The second openings 52 can then be regularly formed in the shielding layer at regular intervals with a laser or the like to form the shielding layer 30 in which the first openings 51 of any shape are irregularly formed and the second openings 52 are regularly formed at regular intervals as shown in FIG. 2C.

As shown in FIG. 2D, the first openings 51 and the second openings 52 may be regularly formed at regular intervals in the electromagnetic wave shielding film 10.

Such first openings 51 and such second openings 52 may be formed with a laser or the like, by etching after the disposition of a resist, by metal plating, or by printing electrically conductive paste so that the openings as mentioned above are formed in the metal foil to be the shielding layer.

In the electromagnetic wave shielding film 10, the insulating layer 20 is not limited as long as it has a sufficient insulating property and can protect the shielding layer 30 and the adhesive layer 40, and the insulating layer 20 is preferably made of a thermoplastic resin composition, a thermosetting resin composition, or an active energy ray-curable composition, for example.

Examples of the thermoplastic resin composition include, but not limited to, a styrene resin composition, a vinyl acetate resin composition, a polyester resin composition, a polyethylene resin composition, a polypropylene resin composition, an imide resin composition, and an acrylic resin composition.

Examples of the thermosetting resin composition include, but not limited to, a phenolic resin composition, an epoxy resin composition, a urethane resin composition, a melamine resin composition, and an alkyd resin composition.

Examples of the active energy ray-curable composition include, but not limited to, a polymerizable compound having at least two (meth)acryloyloxy groups in its molecule.

The insulating layer 20 may be made of a single material or two or more materials.

The insulating layer 20 may include, for example, a curing accelerator, a tackifier, an antioxidant, a pigment, a dye, a plasticizer, a UV absorber, a defoaming agent, a leveling agent, a filler, a flame retardant, a viscosity modifier, and an antiblocking agent, if necessary.

The thickness of the insulating layer 20 is not limited and can be set appropriately according to the need, and the thickness is preferably 1 to 15 μm more preferably 3 to 10 μm.

If the thickness of the insulating layer 20 is less than 1 μm, the insulating layer 20 is so thin that it is difficult to protect the shielding layer 30 and the adhesive layer 40 sufficiently.

If the thickness of the insulating layer 20 is more than 15 μm, the insulating layer 20 is so thick that it is difficult for the electromagnetic wave shielding film 10 to fold and also that the insulating layer 20 itself tends to be broken. Accordingly, it is difficult to apply the electromagnetic wave shielding film to a member which is desired to have bending resistance.

In the electromagnetic wave shielding film 10, the adhesive layer 40 may have the electrical conductivity or may not have the electrical conductivity, and preferably has the electrical conductivity.

First, the case where the adhesive layer 40 has the electrical conductivity is described.

In the case where the adhesive layer 40 has the electrical conductivity, the adhesive layer 40 is preferably composed of an electrically conductive particle and an adhesive resin composition.

The electrically conductive particle is not limited, and may be a metal particulate, a carbon nanotube, a carbon fiber, a metal fiber, or the like.

In the case where the electrically conductive particle is a metal fine particle, the metal fine particle is not limited, and may be silver powder, copper powder, nickel powder, solder powder, aluminum powder, silver-coated copper powder obtained by plating copper powder with silver, or a fine particle obtained by coating a polymer fine particle or glass bead with a metal, for example.

Among these, copper powder or silver-coated copper powder, which is inexpensive, is preferable from an economical viewpoint.

The average particle size of the electrically conductive particle is not limited, and is preferably 0.5 to 15.0 μm.

When the average particle size of the electrically conductive particle is 0.5 μm or more, the electrical conductivity of the adhesive layer is better.

When the average particle size of the electrically conductive particle is 15.0 μm or less, the adhesive layer can be thin.

The shape of the electrically conductive particle is not limited, and may be appropriately selected from spherical, flattened, scaly, dendritic, rod-shaped, or fibrous shapes, for example.

The material of the adhesive resin composition is not limited, and the adhesive resin composition used may be, for example, a thermosetting resin composition such as a styrene resin composition, a vinyl acetate resin composition, a polyester resin composition, a polyethylene resin composition, a polypropylene resin composition, an imide resin composition, an amide resin composition, or an acrylic resin composition; or a thermoplastic resin composition such as a phenol resin composition, an epoxy resin composition, a urethane resin composition, a melamine resin composition, or an alkyd resin composition.

The material for the adhesive resin composition may be any one of these, or a combination of two or more thereof.

The content of the electrically conductive particle in the adhesive layer 40 is not limited, and is preferably 15 to 80 wt % more preferably 15 to 60 wt %.

When the content is within the above-described range, the adhesive layer 40 has improved adhesion to a printed circuit board.

The thickness of the adhesive layer 40 is not limited and can be set appropriately according to the need, and the thickness is preferably 0.5 to 20.0 μm.

If the thickness of the adhesive layer is less than 0.5 μm, there is a tendency that good electrical conductivity cannot be obtained.

If the thickness of the adhesive layer is more than 20.0 μm, the thickness of the electromagnetic wave shielding film as a whole is so thick that it is difficult to handle the electromagnetic wave shielding film.

The adhesive layer 40 may have anisotropic electrical conductivity, or may have isotropic electrical conductivity, and it preferably has anisotropic electrical conductivity.

In the case where the adhesive layer 40 has anisotropic electrical conductivity, the property of transmitting high frequency signals in the signal circuit of a printed circuit board is improved as compared with the case where the adhesive layer 40 has isotropic electrical conductivity.

The anisotropic electrical conductivity can be imparted to the adhesive layer 40 by setting the content of the electrically conductive particle in the adhesive layer 40 within 2 to 40 wt %.

The isotropic electrical conductivity can be imparted to the adhesive layer 40 by setting the content of the electrically conductive particle in the adhesive layer 40 within a range from more than 40 wt % to not more than 80 wt %.

Next, the case where the adhesive layer 40 has no electrical conductivity is described.

In the case where the adhesive layer 40 has no electrical conductivity, the adhesive layer 40 is preferably composed of an adhesive resin composition.

Preferred materials for the adhesive resin composition are the same as the preferred materials for the adhesive resin composition for the case where the adhesive layer 40 has electrical conductivity as described above.

Whether or not the adhesive layer 40 has electrical conductivity, the adhesive layer 40 may include, for example, a curing accelerator, a tackifier, an antioxidant, a pigment, a dye, a plasticizer, a UV absorber, a defoaming agent, a leveling agent, a filler, a flame retardant, and a viscosity modifier, if necessary.

The electromagnetic wave shielding film 10 preferably has a water vapor transmission rate of 40 g or more per m$^2$·24 h, more preferably 200 g or more per m$^2$·24 h, at a temperature of 80° C., a humidity of 95% RH, and a differential pressure of 1 atm, in accordance with JIS K 7129.

If the electromagnetic wave shielding film 10 has such a parameter, volatile components are likely to pass through the shielding layer, so that the volatile components are unlikely to accumulate between the shielding layer and the adhesive layer. Thus, the interlayer adhesion between the shielding layer and the adhesive layer is unlikely to be broken by the volatile components.

In the electromagnetic wave shielding film 10, an anchor coat layer may be formed between the insulating layer 20 and the shielding layer 30.

Examples of a material for the anchor coat layer include a urethane resin, an acrylic resin, a core/shell type composite resin having a urethane resin as the shell and an acrylic resin as the core, an epoxy resin, an imide resin, an amide resin, a melamine resin, a phenol resin, a urea-formaldehyde resin, a blocked isocyanate obtained by reacting a polyisocyanate with a blocking agent such as phenol, a polyvinyl alcohol, and polyvinylpyrrolidone.

The electromagnetic wave shielding film 10 may have a support film on the insulating layer 20 side, and may have a releasing film on the adhesive layer 40 side.

In the case where the electromagnetic wave shielding film 10 has the support film and/or the releasing film, it is easy to handle the electromagnetic wave shielding film 10 in the transport of the electromagnetic wave shielding film 10 and in the operation when a shielded printed circuit board or the like is produced by using the electromagnetic wave shielding film 10.

Such a support film and a releasing film are to be released when the electromagnetic wave shielding film 10 is disposed in a printed circuit board or the like.

The electromagnetic wave shielding film of the present invention is disposed on a printed circuit board and thus serves as a part of a shielded printed circuit board. Such a shielded printed circuit board is described.

Figure 3:
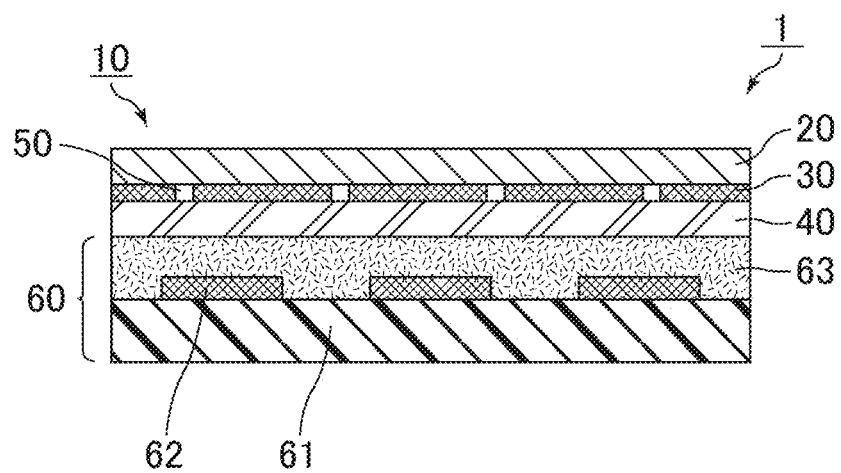
FIG. 3 is a cross-sectional view schematically showing one example of a printed circuit board including an electromagnetic wave shielding film of the present invention.

FIG. 3 is a cross-sectional view schematically showing one example of a printed circuit board including an electromagnetic wave shielding film of the present invention.

A shielded printed circuit board 1 shown in FIG. 3 includes: a printed circuit board 60 having a base member 61 with a printed circuit 62 formed thereon and an insulating film 63 provided on the base member 61 so as to cover the printed circuit 62; and the electromagnetic wave shielding film 10 provided on the printed circuit board 60.

In the shielded printed circuit board 1, the adhesive layer 40 of the electromagnetic wave shielding film 10 is in contact with the insulating film 63 of the printed circuit board.

The shielded printed circuit board 1 includes the electromagnetic wave shielding film 10.

Accordingly, breakage in adhesion is unlikely to be caused at the interlayer between the shielding layer 30 and the adhesive layer 40 of the electromagnetic wave shielding film 10, resulting in better electromagnetic wave shielding characteristics.

The printed circuit 62 may include a ground circuit while the adhesive layer 40 of the electromagnetic wave shielding film 10 is electrically conductive. In such a case, an opening may be formed in the insulating film 63 to expose the ground circuit, so that the adhesive layer 40 may be in contact with the ground circuit.

Such a configuration enables electrical connection of the shielding layer 30 to the ground circuit, whereby electromagnetic wave shielding characteristics are improved.

Both the base member 61 and the insulating film 63 are each preferably made of an engineering plastic material. Examples thereof include resins such as polypropylene, crosslinked polyethylene, polyester, polybenzimidazole, polyimide, polyimideamide, polyetherimide, and polyphenylene sulfide (PPS).

For the printed circuit 62, any common material for circuits, such as copper, can be used.

The base member 61 and the printed circuit 62 may be bonded to each other with an adhesive, or may be joined without any adhesive, as with a so-called adhesive-free copper clad laminate. The insulating film 63 may be a product obtained by bonding a plurality of flexible insulating films to each other with an adhesive, or may be formed by a series of steps of coating, drying, exposing with light, developing, and heat-treatment of a photosensitive insulating resin.

EXAMPLES

Examples for illustrating the present invention more specifically is given below, but the present invention is not limited to these examples.

Example 1

An insulating layer made of an epoxy resin and having a thickness of 5 μm was provided.

On the insulating layer, rolled copper foil having a thickness of 3 μm and including copper oxide (I) particles was then disposed.

Thereafter, etching treatment was carried out on the rolled copper foil to adjust the thickness thereof to 1 μm. Copper oxide (I) in the copper foil was dissolved thereby to form openings, and this was used as a shielding layer.

An image of the shielding layer was photographed through an SEM. The shielding layer part and void parts in the openings were binarized into black and white, respectively, using the image analysis software "GIMP2.10.6".

Figure 4:
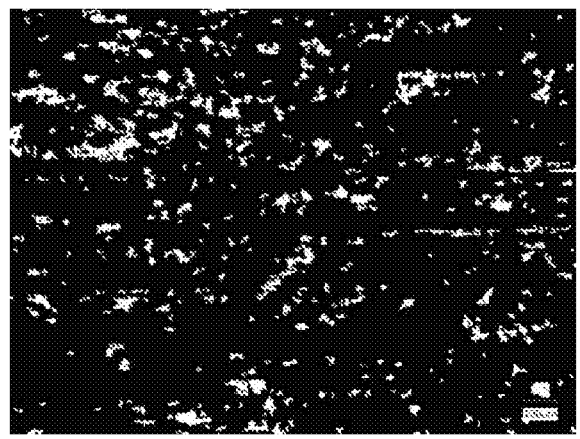
FIG. 4 is a binarized image of a plane photograph of the shielding layer of the electromagnetic wave shielding film according to Example 1.

FIG. 4 shows the binarized SEM image.

FIG. 4 is the binarized image of the plane photograph of the shielding layer of the electromagnetic wave shielding film according to Example 1.

The image was analyzed to calculate the percentage of the number (cumulative frequency) of the first openings, the percentage of the number (cumulative frequency) of the second openings, and the opening rate of the shielding layer. Table 1 shows the results.

Figure 5:
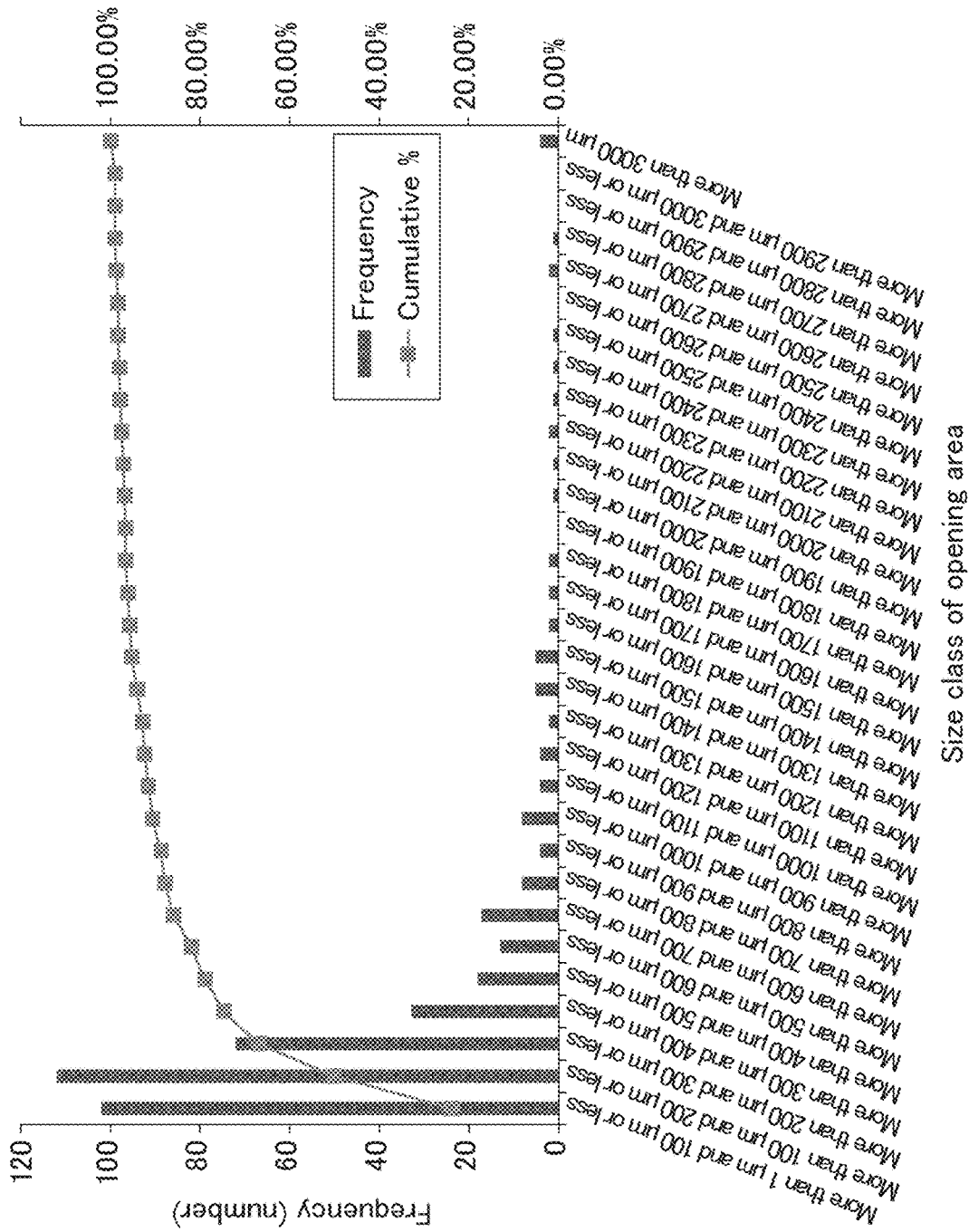
FIG. 5 is a histogram showing the relationship between the size class of the opening area and the cumulative frequency of the number of the openings in the shielding layer of the electromagnetic wave shielding film according to Example 1.

FIG. 5 shows the relationship between the size class of the opening area and the cumulative frequency of the number of the openings formed in the shielding layer according to Example 1.

FIG. 5 is a histogram showing the relationship between the size class of the opening area and the cumulative frequency of the number of the openings in the shielding layer of the electromagnetic wave shielding film according to Example 1.

Then, the shielding layer was coated with a phosphorus-containing epoxy resin containing 20 wt % of Ag-coated Cu powder to form an adhesive layer having electrical conductivity and a thickness of 15 μm. For the coating method, the lip coat technique was used.

Through the above-described steps, the electromagnetic wave shielding film according to Example 1 was prepared.

Comparative Example 1

Rolled copper foil having a thickness of 1 μm (available from JX Metals Corporation) was irradiated with laser to form a plurality of openings, and the irradiated foil was used as a shielding layer.

The shielding layer was photographed through an SEM, and the shielding layer part and void parts in the openings were binarized into black and white, respectively, using the image analysis software "GIMP2.10.6".

Figure 6:
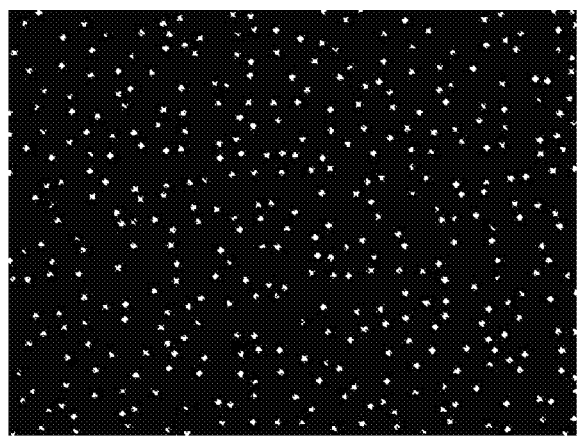
FIG. 6 is a binarized image of a plane photograph of the shielding layer of the electromagnetic wave shielding film according to Comparative Example 1.

FIG. 6 shows the binarized SEM image.

FIG. 6 is the binarized image of the plane photograph of the shielding layer of the electromagnetic wave shielding film according to Comparative Example 1.

The image was analyzed to calculate the percentage of the number (cumulative frequency) of the first openings, the percentage of the number (cumulative frequency) of the second openings, and the opening rate of the shielding layer. Table 1 shows the results.

Figure 7:
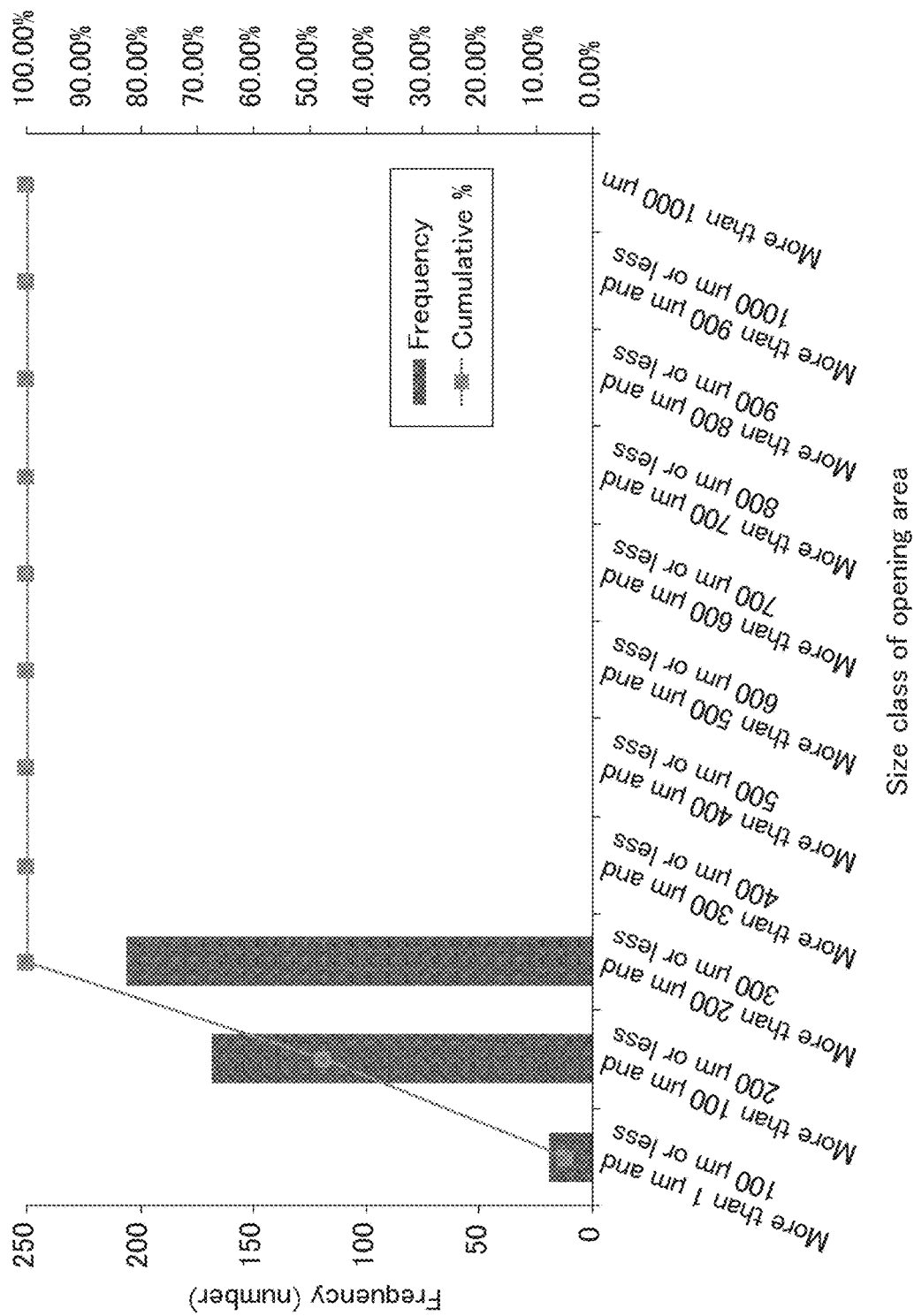
FIG. 7 is a histogram showing the relationship between the size class of the opening area and the cumulative frequency of the number of the openings in the shielding layer of the electromagnetic wave shielding film according to Comparative Example 1.

FIG. 7 shows the relationship between the size class of the opening area and the cumulative frequency of the number of the openings formed in the shielding layer according to Comparative Example 1.

FIG. 7 is a histogram showing the relationship between the size class of the opening area and the cumulative frequency of the number of the openings in the shielding layer of the electromagnetic wave shielding film according to Comparative Example 1.

The shielding layer was next disposed on an insulating layer made of an epoxy resin having a thickness of 5 μm.

Then, the shielding layer was coated with a phosphorus-containing epoxy resin containing 20 wt % of Ag-coated Cu powder to form an adhesive layer having electrical conductivity and a thickness of 15 μm. For the coating method, the lip coat technique was used.

Through the above-described steps, the electromagnetic wave shielding film according to Comparative Example 1 was prepared.

Comparative Example 2

An insulating layer made of an epoxy resin and having a thickness of 5 μm was provided.

Silver paste was applied to one main surface of the insulating layer by printing to form a silver layer of 50 nm.

In this case, circular exposed portions having a diameter of 100 μm were regularly formed in the silver layer at intervals of 1000 μm.

Next, the insulating layer after the printing with the silver paste was immersed in an electroless copper plating solution ("AGR copper", pH 12.5, manufactured by OKUNO CHEMICAL INDUSTRIES CO., LTD.) at 55° C. for 20 minutes to form an electroless copper plating film (thickness 0.5 μm) on the silver layer.

Then, the surface of the electroless copper plating film obtained above was set on a cathode, and phosphorus-containing copper was set on an anode. Electroplating was carried out with an electroplating solution containing copper sulfate at a current density of 2.5 A/dm$^2$ for 30 minutes to thereby laminate the silver layer with a copper plating layer having a total thickness of 1 μm, obtaining a shielding layer. As the electroplating solution, a solution was used that contained 70 g/L of copper sulfate, 200 g/L of sulfuric acid, 50 mg/L of chloride ions, and 5 g/L of TOP LUCINA SF (glossing agent, manufactured by OKUNO CHEMICAL INDUSTRIES CO., LTD.).

The shielding layer was photographed through an SEM, and the shielding layer part and void portions in the openings were binarized into black and white, respectively, using the image analysis software "GIMP2.10.6".

Figure 8:
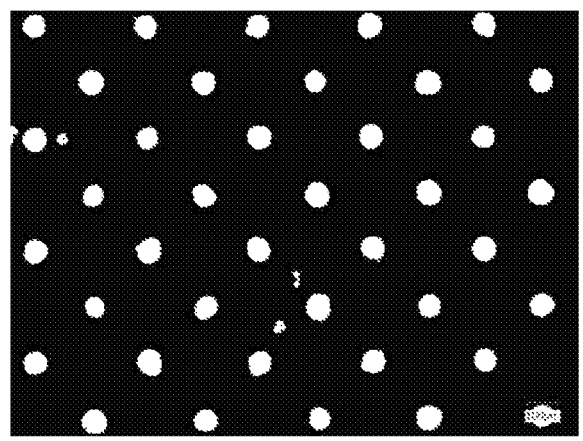
FIG. 8 is a binarized image of a plane photograph of the shielding layer of the electromagnetic wave shielding film according to Comparative Example 2.

FIG. 8 shows the binarized SEM image.

FIG. 8 is the binarized image of the plane photograph of the shielding layer of the electromagnetic wave shielding film according to Comparative Example 2.

The image was analyzed to calculate the percentage of the number (cumulative frequency) of the first openings, the percentage of the number (cumulative frequency) of the second openings, and the opening rate of the shielding layer. Table 1 shows the results.

Figure 9:
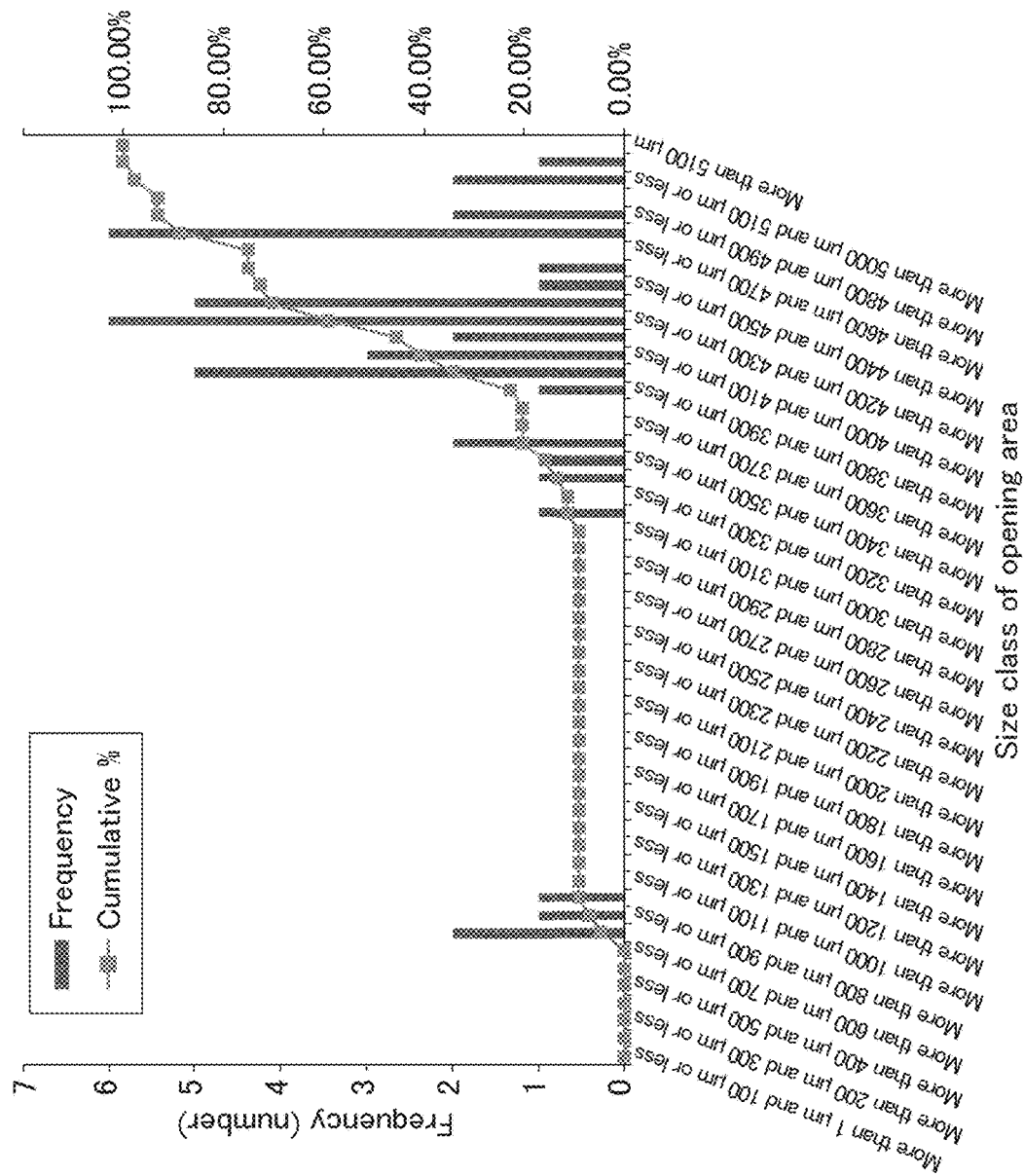
FIG. 9 is a histogram showing the relationship between the size class of the opening area and the cumulative frequency of the number of the openings in the shielding layer of the electromagnetic wave shielding film according to Comparative Example 2.

FIG. 9 shows the relationship between the size class of the opening area and the cumulative frequency of the number of the openings formed in the shielding layer according to Comparative Example 2.

FIG. 9 is a histogram showing the relationship between the size class of the opening area and the cumulative frequency of the number of the openings in the shielding layer of the electromagnetic wave shielding film according to Comparative Example 2.

Then, the shielding layer was coated with a phosphorus-containing epoxy resin containing 20 wt % of Ag-coated Cu powder to form an adhesive layer having electrical conductivity and a thickness of 15 μm. For the coating method, the lip coat technique was used.

Through the above-described steps, the electromagnetic wave shielding film according to Comparative Example 2 was prepared.

(Evaluation of Interlayer Breaking)

Each of the electromagnetic wave shielding films according to Example 1 was disposed on a printed circuit board by heat-pressing. Then, the resulting printed circuit board was allowed to stand for 7 days in a clean room at 23° C. and a humidity of 63% RH, and then exposed to a temperature condition of reflow, and whether interlayer breaking was caused was evaluated. For the temperature condition of reflow, a temperature profile with a maximum of 265° C. was set on the assumption that lead-free solder was used. To evaluate whether interlayer breaking was caused, the printed circuit board with the shielding films adhered thereto was allowed to pass an IR reflow system five times, and it was visually observed whether any blister was caused.

As a result, no blister is caused on the electromagnetic wave shielding film according to Example 1 at all.

TABLE 1

| | Example 1 | Comparative Example 1 | Comparative Example 2 |
|---|---|---|---|
| Percentage of the number (cumulative frequency) of first openings | 66% | 0% | 100% |
| Percentage of the number (cumulative frequency) of second openings | 34% | 100% | 0% |
| Opening rate | 7.47% | 3.20% | 7.40% |
| Evaluation of bending resistance | Good | Poor | Poor |
| Evaluation of electromagnetic wave shielding characteristic | ±0% | −20% | −30% |

(Evaluation of Bending Resistance)

The electromagnetic wave shielding films according to Example 1 and Comparative Examples 1 to 2 were evaluated by the following method.

Two sheets of the electromagnetic wave shielding films were heat-pressed to be adhered to the respective surfaces of a polyimide film having a thickness of 50 µm, and the resultant was cut into a sample having a size of length× width=130 mm×15 mm. The bending resistance of the sample was determined using a MIT folding fatigue resistance tester (No. 307 MIT Type Folding Endurance Tester, manufactured by YASUDA SEIKI SEISAKUSHO, LTD.) by the method defined in JIS P 8115:2001.

The test conditions were as follows.

Top of the folding clamp, R: 0.38 mm

Folding angle: +135° folding speed: 175 cpm

Weight load: 500 gf

Detection method: sensing disconnection in the shielding film by a built-in conducting unit The evaluation scale for the bending resistance was as follows. Results are shown in Table 1.

Good: no disconnection was caused even when the sample was folded 2500 times.

Poor: disconnection was caused when the sample was folded less than 2500 times.

(Evaluation of Electromagnetic Wave-Shielding Characteristics)

The electromagnetic wave shielding films according to Example 1 and Comparative Examples 1 to 2 were measured for the electromagnetic wave shielding characteristics by a coaxial tube method.

In the coaxial tube method, the attenuation of electromagnetic waves at 1 to 10 GHz caused by the electromagnetic wave shielding films according to Example 1 and Comparative Examples 1 to 2 was determined using a coaxial tube-type system for determining the electromagnetic wave shielding effect, manufactured by KEYCOM Corp. under the conditions of a temperature of 25° C. and a relative humidity of 30 to 50%, in accordance with ASTM D4935. Table 1 shows the results.

The ratio (%) in the evaluation of the electromagnetic wave shielding characteristic in Table 1 means the ratio of the attenuation of an electric field at 10 GHz to the attenuation of an electric field at 1 GHz.

As shown in Table 1, it was proved that, in the electromagnetic wave shielding film according to Example 1, the electromagnetic wave shielding characteristic in the high frequency region did not decrease as compared with the electromagnetic wave shielding characteristic in the low frequency region. Furthermore, it was proved that the bending resistance was sufficiently high.

Meanwhile, it was proved that, in the electromagnetic wave shielding films according to Comparative Examples 1 and 2, the electromagnetic wave shielding characteristics in the high frequency region decreased as compared with the electromagnetic wave shielding characteristics in the low frequency region. Furthermore, it was proved that the bending resistances were insufficient.

REFERENCE SIGNS LIST 1 shielded printed circuit board
10 electromagnetic wave shielding film
20 insulating layer
30 shielding layer
40 adhesive layer
50 opening
51 first opening
52 second opening
60 printed circuit board
61 base member
62 printed circuit
63 insulating film

The invention claimed is:

1. An electromagnetic wave shielding film comprising:
an adhesive layer;
a shielding layer placed on the adhesive layer; and
an insulating layer placed on the shielding layer,
wherein a plurality of openings having an opening area of 1 to 5000 $\mu m^2$ are formed in the shielding layer,
the openings include first openings having opening areas of more than 1 $\mu m^2$ and 300 $\mu m^2$ or less and second openings having opening areas of more than 300 $\mu m^2$ and 5000 $\mu m^2$ or less, and
a percentage of the number (cumulative frequency) of the first openings among the openings is 30 to 90%, and a percentage of the number (cumulative frequency) of the second openings among the openings is 10 to 70%.

2. The electromagnetic wave shielding film according to claim 1, wherein the shielding layer has an opening rate of 3 to 10%.

3. The electromagnetic wave shielding film according to claim 1, wherein the electromagnetic wave shielding film has a water vapor transmission rate of 40 g or more per $m^2 \cdot 24$ h at a temperature of 80° C., a humidity of 95% RH, and a differential pressure of 1 atm, in accordance with JIS K 7129.

4. The electromagnetic wave shielding film according to claim 1, wherein the shielding layer comprises a metal layer.

5. The electromagnetic wave shielding film according to claim 4, wherein the metal layer comprises at least one metal selected from the group consisting of copper, silver, gold, aluminum, nickel, tin, palladium, chromium, titanium, or zinc.

* * * * *